United States Patent [19]

Kuok

[11] Patent Number: 5,414,758
[45] Date of Patent: May 9, 1995

[54] AUDIO RECORDING APPARATUS USING AN IMPERFECT MEMORY CIRCUIT

[75] Inventor: Henry H. Kuok, Liverpool, N.Y.

[73] Assignee: Thomson Consumer Electronics, Inc., Indianapolis, Ind.

[21] Appl. No.: 47,017

[22] Filed: Apr. 14, 1993

Related U.S. Application Data

[63] Continuation of Ser. No. 638,506, Jan. 7, 1991, abandoned.

[51] Int. Cl.⁶ ............................................. H04M 1/64
[52] U.S. Cl. ...................................... 379/88; 379/67; 379/51; 365/45; 365/200; 371/15.1; 371/21.1
[58] Field of Search ................. 379/51; 365/200, 45, 365/201; 371/10.1, 10.2, 21.1

[56] References Cited

U.S. PATENT DOCUMENTS

| | | | |
|---|---|---|---|
| 4,815,122 | 3/1989 | Shefler | 379/67 |
| 4,850,005 | 7/1989 | Hashimoto | 379/88 |
| 4,891,835 | 1/1990 | Leung et al. | 379/51 |

OTHER PUBLICATIONS

Page of data sheets for the TMS4C102-series Dynamic Random Access Memories (DRAM).
Preliminary application note for the Samsung One Chip Voice Recorder (KD5915).
Article entitled Audio DRAM 1MEG X 1 Audio DRAM, publ. by Micron Technology, Inc., dtd. Sep. 1989.

*Primary Examiner*—James L. Dwyer
*Assistant Examiner*—Fan Tsang
*Attorney, Agent, or Firm*—Joseph S. Tripoli; Peter M. Emanuel; Thomas F. Lenihan

[57] ABSTRACT

It is herein recognized that in an audio signal processing system, a DRAM chip for storing digitized audio signals and selected to include at least one inoperative memory location, is acceptable for use as a storage medium in that no noticeable error is produced on playback of the recorded signal due to the sampling rate of the audio signal and due to the relatively low rate of defects allowed. Furthermore, the use of a less-than-perfect DRAM chip for storing audio information is acceptable due to the substantially non-critical nature of audio signals, as opposed to the extremely critical nature of computer data.

16 Claims, 2 Drawing Sheets

AUDIO RECORDING APPARATUS USING AN IMPERFECT MEMORY CIRCUIT

This is a continuation of application Ser. No. 07/638,506, filed Jan. 7, 1991, now abandoned.

FIELD OF THE INVENTION

The subject application generally concerns the field of memory circuits, and specifically concerns the use of memory circuits for storing digitized audio signals in a telephone answering machine.

BACKGROUND OF THE INVENTION

Telephone answering machines employing tape recorders for recording incoming messages are now commonly available. A first problem exists in that each of these machines employs a costly tape transport mechanism which must be assembled and adjusted during manufacturing, and which is subject to mechanical wear. A second problem exists in that each of these machines includes at least one head for erasing data from the tape, writing new data to the tape, and reading data from the tape, and also includes corresponding electronic circuitry for providing proper signals to the record head, and for receiving, amplifying, and demodulating signals from the read head. A third problem exists in that the tape transport mechanism is motor-driven and consumes a relatively large amount of power.

One skilled in the art might consider digitizing the incoming audio messages and storing them in a memory device. A suitable memory size for an application in an answering machine is approximately 1 Mbit (i.e., a memory chip having 1,048,576 data storage locations, each capable of holding 1 bit of data). Such a 1 Mbit dynamic random access memory integrated circuit (DRAM, or dynamic RAM) is known from the TI TMS4C102, manufactured by Texas Instruments Corporation, Dallas Tex. This DRAM is organized as a 1,048,576 X 1 array of memory locations.

However, heretofore the use of a 1 Mbit dynamic RAM was impractical, because while the computer industry commonly employs 1 Mbit DRAMs (hereinafter referred to as "computer grade" DRAM), the cost of such 1 Mbit DRAM chips is prohibitively high for consumer products. The cost is high because, as noted above, each DRAM chip has 1,048,576 memory locations, each of which must function perfectly. This constraint causes relatively low yields of good DRAM chips and relatively high yields of DRAM chips which are unusable by the computer industry.

SUMMARY OF THE INVENTION

It is herein recognized that the data-storage capability exhibited by computer-grade DRAM chips has an accuracy which far exceeds that required by a memory chip for a digital audio recording system. Stated another way, it is herein recognized that in an audio signal processing system, a DRAM chip for storing digitized audio signals including a predetermined number of inoperative memory locations, is acceptable for use as a storage medium in that no noticeable error is produced on playback of the recorded signal due to the sampling rate of the audio signal, the relatively small number of inoperative memory locations, and the relatively large number of operative memory locations. Furthermore, the use of a less-than-perfect DRAM chip for storing audio information is acceptable due to the generally non-critical nature of audio signals.

It is also herein recognized that the DRAM manufacturer benefits as a result of this invention in that the manufacturer may now select, package, and sell DRAM units that he was previously discarding.

DETAILED DESCRIPTION OF THE EMBODIMENT

While the present invention is to be described in the environment of a telephone answering machine, the invention is not intended to be limited to that environment, and may in fact be applicable to apparatus for storing any digitized audio signals.

While the invention is described with respect to Dynamic Random Access Memory (DRAM), the principles of the invention are also equally applicable to static RAM, Electrically Erasable Read Only Memory (EEROM), and the like, and the scope of the invention is specifically intended to include such other memory units.

Figure 1:
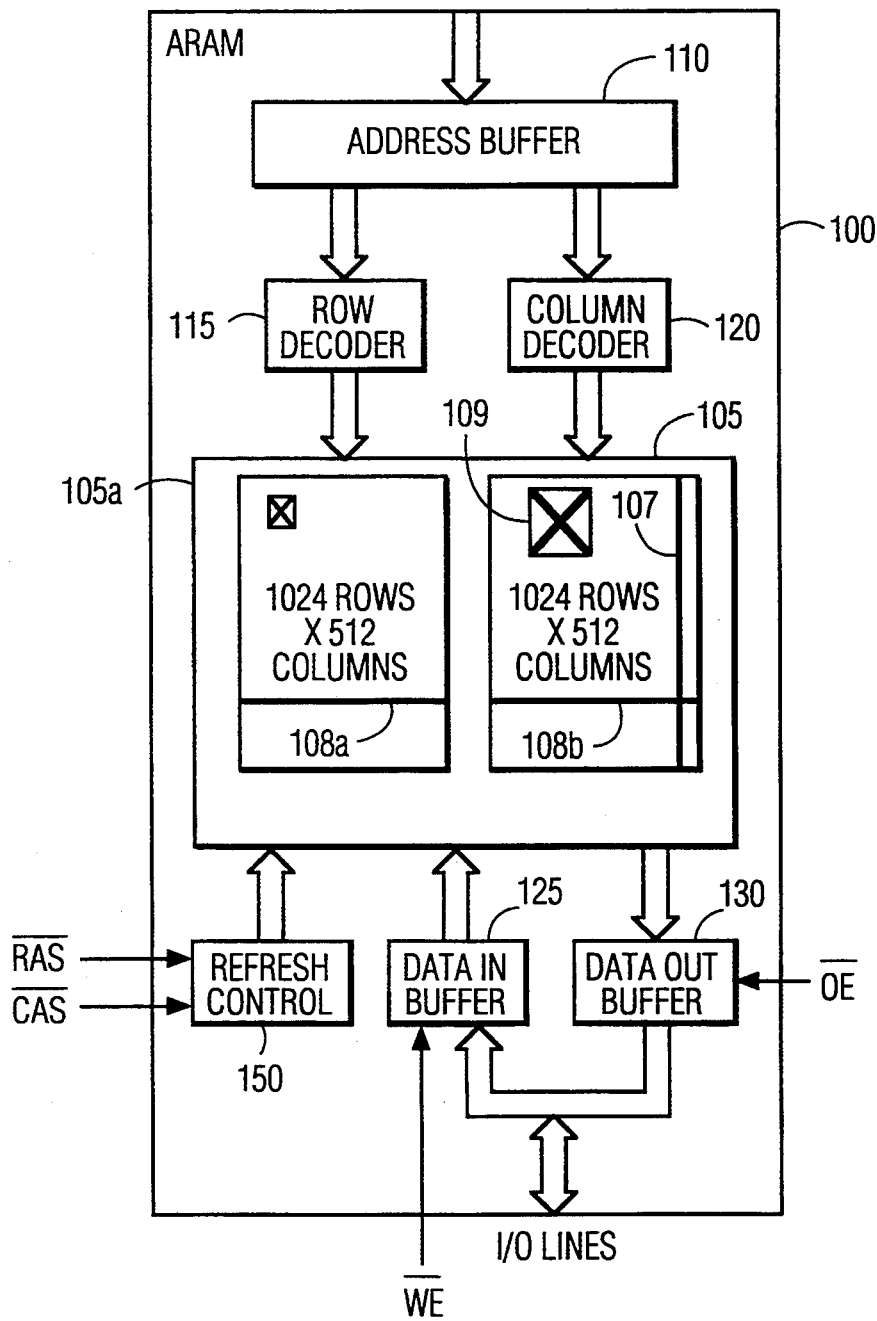
FIG. 1 shows, in block diagram form, a random access memory circuit in accordance with the subject invention.

As noted above, it is herein recognized that the use of "perfect" (i.e., computer-grade) RAM chips, while mandatory for computer applications, is not necessary for the storage of digitized audio signals. Instead, a RAM chip having a limited number of defects (hereinafter referred to as "audio grade" RAM or "ARAM") is suitable for the recording of digitized audio signals. Such an ARAM chip 100 is shown in FIG. 1. ARAM chip 100 may be of the dynamic type (requiring periodic refreshing of the memory contents), or of the static type (requiring no refreshing of the memory contents). ARAM chip 100 is a 1 Mbit memory unit having 1,048,576 memory locations (i.e., $2^{20}$ memory cells arranged as two arrays, each having 1024 rows and 512 columns).

In addition to the address and data lines, ARAM 100 includes a write enable line $\overline{WE}$ an output enable line $\overline{OE}$, a row refresh line $\overline{RAS}$, and a column refresh line $\overline{CAS}$. The address lines are coupled to an address buffer 110, which applies the address data to a row decoder unit 115, and a column decoder unit 120. Decoded row and column information is applied to memory matrix 105. Memory matrix 105 is divided into two portions 105a and 105b, each having 1024 rows and 512 columns of memory locations. While row decoder unit 115 and column decoder unit 120 are shown as being common to both memory matrices 105a and 105b, each memory matrix may have its own respective row decoder unit and column decoder unit. The refresh lines $\overline{RAS}$ and $\overline{CAS}$ are coupled to a refresh control unit 150 for periodically refreshing the memory contents. Depending upon the logical organization of the particular DRAM used (i.e., 1 Mbit X 1, or 256 Kbits X 4), the input output (I/O) port 140 may comprise a single line or several lines. Data for storage is latched in a DATA IN BUFFER unit 125 prior to being applied to memory matrix 105. Similarly, data being read out of memory matrix 105 is latched in a DATA OUT BUFFER unit 130, and applied to I/O port 140 under control of the OUTPUT ENABLE ($\overline{OE}$) line.

An ARAM is distinguished from computer-grade DRAM by the presence of an acceptable number of defective memory locations. Four different types of memory defects are shown in FIG. 1. Each of these types of defects is acceptable for digital audio storage applications providing that each is held within a certain respective limit. Element 106 of memory matrix 105a represents a single defective ("bad") location. The limit for single bad locations is 0.2% of the memory size, or a total of 2098 defective memory locations in a 1 Mbit memory chip. This limit was determined by taking into account the fact that an average English spoken word has a duration of approximately 300 milliseconds, and also that the duration of a sample at a 32 kHz sampling rate is approximately 30 microseconds. Elements 108a and 108b represent a bad row of memory locations, that is locations into which data cannot be written, or from which data cannot be read. The limit for bad rows is a total of 4 bad rows, or two consecutive bad rows. Element 107 represents a bad column of memory locations, that is 1024 locations into which data cannot be written, or from which data cannot be read. The limit for bad columns is 2, whether consecutive or not. Note that data read from row 108a will be read by the sense amplifiers (not shown) of memory array 105a, while data from row 108b will be read by the different sense amplifiers (not shown) of memory matrix 105b. Thus, a "bad" row in memory matrix 105a will most probably be a "good" row in memory matrix 105b. Therefore, a bad row most probably only disables 512 memory locations instead of 1024 locations, as is the case for a bad column. Element 109 in memory matrix 105b represents a bad array of memory locations. The limit on the size of this array is 32K (i.e., 32,768) defective memory locations. This number far exceeds the maximum number for single bad memory locations (i.e., 2048), but is acceptable in that they are grouped together in a definable block which can easily be avoided by simply not accessing the locations within that block. It is noted that 32K bad locations is only 3.125% of the total memory allocation of a 1 Mbit ARAM.

As noted above, the DRAM manufacturer benefits as a result of this invention in that the manufacturer may now select DRAM chips for defects within a prescribed range, package these DRAM units which were previously discarded, and sell them to the consumer audio electronics industry as ARAM. In addition, the manufacturers of consumer audio electronics equipment benefit in that they may utilize ARAM in their products at approximately 1/20 the cost of computer-grade DRAM. There are, however, some failures which render the memory device unacceptable even for digital audio signal storage purposes. Such failures include a failure of any address line, the $\overline{RAS}$ line, the $\overline{CAS}$ line, the $\overline{WE}$ line, and the $\overline{OE}$ line.

Figure 2:
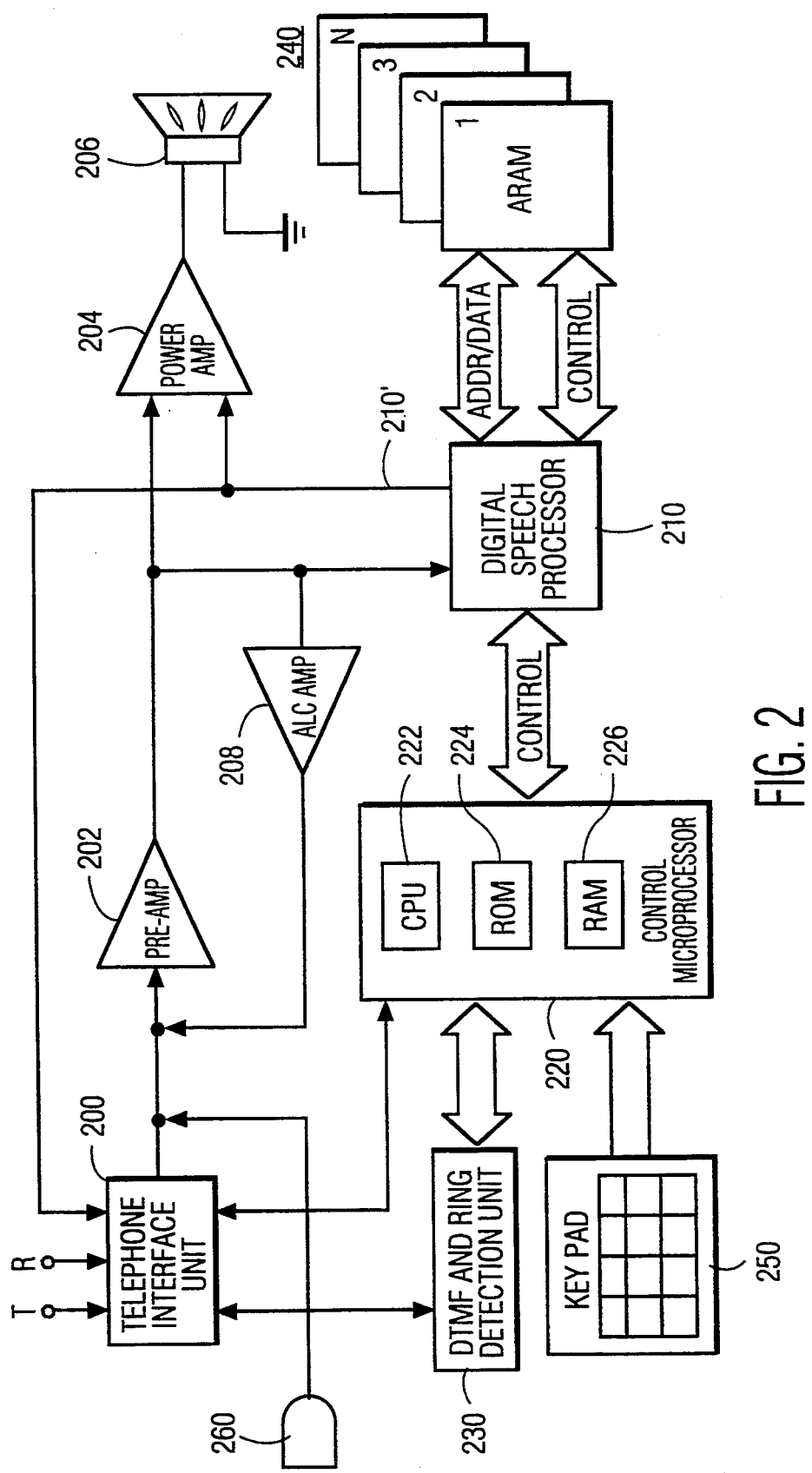
FIG. 2 shows, in block diagram form, a telephone answering machine incorporating the subject invention.

A telephone answering system employing ARAM units is shown in FIG. 2. A telephone interface unit 200 is coupled to the telephone network via lines T (tip) and R (ring). Telephone interface unit 200 couples received audio signals to an audio preamplifier unit 202 which is gain-controlled by an Automatic Level Control (ALC) amplifier 208. The amplified audio signals are applied to a Power Amplifier 204 for reproduction in a speaker unit 206. Amplified audio signals produced by preamplifier unit 202 are also applied to a Digital Speech Processor unit 210 for sampling and conversion into a digital representation of the received audio signal. Digital Speech Processor unit 210 may be, for example, a KS5915 Voice Recording and Reproducing Integrated Circuit, manufactured by Samsung Electronics of The Republic of Korea. The digitized audio signals are stored, under control of digital speech processor unit 210, in an array of ARAM units generally designated 240, and individually numbered 1-N. As noted above, ARAM array 240 comprises an array of 1 Mbit DRAMs, each of which was selected by the manufacturer to include at least one defective memory location. Although 1 Mbit ARAM chips were chosen for this embodiment, it is noted that the ARAM chips may be of any size, 256 kbits or greater.

Digital speech processor unit 210 is, in turn, controlled by a controller 220. Controller 220 may be a microcomputer, a microprocessor, or a custom integrated circuit. Controller 220 includes a CPU 222, program ROM array 224, and an internal RAM array 226. Controller 220 receives input from an external keypad 250, and communicates bidirectionally over the telephone network via a DTMF AND RING DETECTION unit 230. The initials DTMF are known to those skilled in the telephone art to mean Dual Tone Multi Frequency, and signify a method for encoding digits into a dual tone signal. Ring detection is also accomplished by unit 230 which passes ring information to controller 220. A microphone 260 provides an alternate source of audio signals to the system, and is used for entering the "hello" message which the answering machine automatically delivers after answering incoming telephone calls.

Note that the apparatus of FIG. 2 does not include a tape recorder mechanism, or tape recording electronics. All messages, whether incoming or outgoing, are stored in ARAM array 240 in digitized form. In operation, controller 220, upon detecting a ring signal via DTMF AND RING DETECTION UNIT 230, controls digital speech processor unit 210 to read data corresponding to a previously stored "hello" message from ARAM array 240, to convert the digital data to analog form, and to apply the converted analog signal to telephone interface unit 200 via a wire 210'. Thereafter, controller 220 controls digital speech processor 210 to convert the incoming message to digital form and store the resulting data in an incoming message storage area of ARAM array 240.

Audio signals are sampled by digital speech processor 210 at a rate of 22 kHz. The KS5915 Voice Recording and Reproducing Integrated Circuit utilizes a conversion technique known in the art as Adaptive Delta Modulation. Adaptive Delta Modulation is known from the textbook "Information Transmission, Modulation, and Noise" by Mischa Schwartz, published by McGraw-Hill Book Company, New York. This technique oversamples the incoming audio signal and produces a one-bit output signal which expresses the relationship between the audio signal being sampled and a prediction signal which is based upon the last audio signal sample, or accumulation of samples. For a nonchanging audio signal, the output of the converter is a bit stream of alternating ones and zeroes. For a rapidly rising audio signal, the output of the converter is a stream of bits containing more ones than zeros. For a rapidly falling audio signal, the output of the converter is a stream of bits containing more zeros than ones. The term "adaptive" in the phrase "adaptive delta modulation sampling" denotes that the quantization step size is kept small, to reduce quantization noise to a tolerable level, until the slope of the audio signal begins to rise so quickly that the converter cannot track the incoming signal. This condition is known as slope overload and is manifested in the output by a string of output values of the same polarity. When this condition is detected, the step size is increased. If the output values alternate in polarity for a specified number of sampling intervals, indicating a signal which is not changing very much in time, the step size is reduced. The 22K sampling rate is sufficient for adaptive delta modulation sampling for telephone audio signals, which exhibit a bandwidth from 300 Hz to 3 kHz, inclusive. It should be noted that a single bit not working in the ARAM will cause the loss of only one sample in a given period of samples. This is acceptable because each of the bits has the same weight in an adaptive delta modulation system (i.e., one quantization level). Thus, after encountering a single bad bit, the output signal will be exhibit an error of only one quantization level. This error will be reduced further by output signal filtering also included within the KS5915 Voice Recording and Reproducing Integrated Circuit (i.e., maximum output audio frequency=2.5 kHz)

The ARAM specifications noted above were generated with regard to the use of the defective DRAM for digitized audio signal storage, and are summarized in the following table:

| Allowable: | Single Bit Not Working | Max .2% |
| --- | --- | --- |
|  | Columns Not Working | Max 2 |
|  | Rows Not Working | Max 4 |
| Disallowed: | Array Failure | >32 Kbits |
|  | Consecutive Col/Row Fail | >2 |
|  | Any Control Pin Failure | Address, $\overline{\text{RAS}}$, $\overline{\text{CAS}}$, $\overline{\text{WE}}$, $\overline{\text{OE}}$, Data. |

As noted above, the underlying philosophy supporting the use of ARAMs for recording digitized audio signals is that the single defective memory locations do not have to be avoided. The data lost from these locations will appear as "drop outs" in the reconstructed audio signal, but will be substantially imperceptible to a listener because of the relatively much larger number of good samples in any given time. The restrictions on consecutive row and column failures prevent large numbers of defects from being adjacent to one another, a failure mode which might otherwise produce noticeable audio distortion.

While the digital processing technique used in the above-given example is Adaptive Delta Modulation, it is herein recognized that the following digital processing techniques are equally applicable to the invention: pulse code modulation (PCM), Delta Modulation, Adaptive Differential Pulse Code Modulation (ADPCM).

What is claimed is:

1. Apparatus for storing data related to a first audio signal and producing a reconstructed audio signal therefrom, comprising:

a circuit for sampling said first audio signal at a predetermined rate and producing data related to a direction of an amplitude change of said first audio signal with respect to the amplitude of a previous sample of said first audio signal;

a memory circuit for storing said data, said memory circuit including a plurality of data storage locations arranged in columns and rows and including among said data storage locations a column of inoperative data storage locations but not more than 2 columns of inoperative data storage locations;

control means for applying said data to operative data storage locations and to said inoperative data storage locations of said memory circuit without avoiding said inoperative data storage locations;

said control means producing said reconstructed audio signal by using said data read from said operative data storage locations and said inoperative data storage locations; and filter means responsive to said reconstructed audio signal for reducing a difference between said reconstructed audio signal and said first audio signal.

2. The apparatus of claim 1 wherein said first audio signal is sampled at a rate which is ten times the highest frequency exhibited by said first audio signal, and said first audio signal is sampled by use of an adaptive delta modulation technique.

3. The apparatus of claim 1, wherein said apparatus is in a telephone answering machine and said first audio signal is an outgoing message entered by user.

4. The apparatus of claim 1 wherein said apparatus is in a telephone answering machine and said first audio signal is an incoming message entered by a caller.

5. Apparatus for storing digitized samples of a first audio signal, comprising:

a memory circuit for storing said digitized audio samples, said memory circuit including a plurality of data storage locations arranged in columns and rows among which is memory circuit including among said data storage locations a row of inoperative data storage locations but not more than 4 rows of inoperative data storage locations nor more than 2 consecutive rows of inoperative data storage locations;

said memory circuit storing quantization level data corresponding to the direction of a change of said audio signal;

control means for applying said quantization level data to operative data storage locations and to said inoperative data storage locations without avoiding said inoperative data storage locations;

said control means producing a reconstructed audio signal by reading and using said quantization level data from said operative data storage locations and from said inoperative data storage locations; and filter means responsive to said reconstructed audio signal for reducing the difference between said reconstructed audio signal and said first audio signal.

6. The apparatus of claim 5 wherein said first audio signal is sampled at a rate which is ten times the highest frequency exhibited by said first audio signal, and first said audio signal is sampled by use of an adaptive delta modulation technique.

7. The apparatus of claim 5, wherein said apparatus is in a telephone answering machine and said first audio signal is an outgoing message entered by user.

8. The apparatus of claim 5 wherein said apparatus is in a telephone answering machine and said first audio signal is an incoming message entered by a caller.

9. Apparatus for storing digitized samples of a first audio signal, comprising:

a memory circuit for storing said digitized audio samples, said memory circuit including a plurality of data storage locations arranged in columns and rows;

said memory circuit including among said data storage locations at least one individual inoperative data storage location but no more than 0.2% of the total number of data storage locations of said memory circuit, said inoperative data storage locations not including more than 2 columns of inoperative data storage locations, nor more than 4 rows of inoperative data storage locations, nor more than 2 consecutive rows of inoperative data storage locations;

said memory circuit storing quantization level data corresponding to the direction of a change of said digitized audio signal data;

control means for applying said quantization level data to operative data storage locations and to said inoperative data storage locations of said memory circuit without avoiding said inoperative data storage locations;

said control means producing a reconstructed audio signal by reading and using said quantization level data stored in said operative data storage locations and from said inoperative data storage locations; and filter means responsive to said reconstructed audio signal for reducing a difference between said reconstructed audio signal and said first audio signal.

10. The apparatus of claim 9 wherein said first audio signal is sampled at a rate which is ten times the highest frequency exhibited by said first audio signal, and first said audio signal is sampled by use of an adaptive delta modulation technique.

11. The apparatus of claim 9, wherein said apparatus is in a telephone answering machine and said first audio signal is an outgoing message entered by user.

12. The apparatus of claim 9 wherein said apparatus is in a telephone answering machine and said first audio signal is an incoming message entered by a caller.

13. A method for recording an analog audio signal in a memory having both operative and inoperative memory locations, and reproducing said analog audio signal therefrom, comprising the steps of:

converting said analog audio signal to a sequence of digital data samples, each of said digital data samples representing the direction of a change in amplitude of said audio signal relative to a previous data sample;

writing said data samples to respective ones said memory locations of said memory regardless of whether said memory locations are operative or inoperative;

reading data samples from respective ones said memory locations of said memory regardless of whether said memory locations are operative or inoperative to produce a sequence of recovered data samples including both errors caused by reading data from said inoperative memory locations; and filtering said sequence of recovered data samples to produce a reconstructed analog audio signal.

14. The method recited in claim 13, further including the step of:

utilizing a memory in which no more than 0.2% of the total number of memory locations are inoperative.

15. The method recited in claim 13, wherein:

said converting step produces a sequence of one bit data samples.

16. A method for storing data related to a first audio signal and producing a reconstructed audio signal therefrom, comprising the steps of:

selecting a memory circuit for storing said data, said memory circuit including a plurality of data storage locations among which is at least one individual inoperative data storage location but no more than 0.2% of the total number of data storage locations are inoperative;

storing in said memory circuit quantization level data corresponding to the direction of a change in amplitude of said audio signal;

applying said quantization level data to both said operative data storage locations and to said inoperative data storage locations of said memory circuit without avoiding said inoperative data storage locations;

producing a reconstructed audio signal by reading and using data from both said operative data storage locations and from said inoperative data storage locations; and filtering said reconstructed audio signal to reduce the difference between said reconstructed audio signal and said first audio signal.

* * * * *